(12) United States Patent
Chang

(10) Patent No.: US 7,773,164 B2
(45) Date of Patent: Aug. 10, 2010

(54) ACTIVE DEVICE ARRAY SUBSTRATE

(75) Inventor: Yang-Hui Chang, Hsinchu County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 445 days.

(21) Appl. No.: 11/964,716

(22) Filed: Dec. 27, 2007

(65) Prior Publication Data

US 2009/0045463 A1 Feb. 19, 2009

(30) Foreign Application Priority Data

Aug. 14, 2007 (TW) .............................. 96129972 A

(51) Int. Cl.
*G02F 1/1333* (2006.01)
*H01L 23/482* (2006.01)
(52) U.S. Cl. .......................................... 349/40; 257/59
(58) Field of Classification Search .................. 349/40, 349/48, 49, 50; 257/355, 786, 59, 72
See application file for complete search history.

(56) References Cited

U.S. PATENT DOCUMENTS

| 6,696,701 | B2* | 2/2004 | Hector et al. ................. 257/72 |
| 7,358,536 | B2* | 4/2008 | Lai .............................. 257/88 |
| 7,375,724 | B2* | 5/2008 | Jiang et al. ................... 345/204 |
| 7,439,589 | B2* | 10/2008 | Lai ............................. 257/355 |
| 7,626,647 | B2* | 12/2009 | Ker et al. ..................... 349/40 |
| 2003/0234904 | A1 | 12/2003 | Matsuda et al. |
| 2005/0190168 | A1* | 9/2005 | Jiang et al. ................... 345/204 |
| 2005/0285984 | A1* | 12/2005 | Tsai et al. ..................... 349/40 |
| 2006/0279667 | A1* | 12/2006 | Tsai et al. ..................... 349/40 |
| 2007/0007523 | A1* | 1/2007 | Lai .............................. 257/59 |
| 2007/0029615 | A1* | 2/2007 | Lai ............................. 257/355 |
| 2010/0053489 | A1* | 3/2010 | Kang et al. ................... 349/48 |

FOREIGN PATENT DOCUMENTS

| CN | 1165568 | 11/1997 |
| CN | 1693956 | 11/2005 |
| CN | 1766722 | 5/2006 |
| TW | 200532306 | 10/2005 |

OTHER PUBLICATIONS

"1st Office Action of China counterpart application", issued on Jul. 10, 2009, p. 1-p. 6.

* cited by examiner

*Primary Examiner*—Akm E Ullah
(74) *Attorney, Agent, or Firm*—Jianq Chyun IP Office

(57) ABSTRACT

An active device array substrate including a substrate, a plurality of pixel units, a plurality of driving lines, a plurality of common lines, an electrostatic discharge (ESD) protection circuit, and a plurality of switch elements is provided. The substrate has a display region and a peripheral region adjacent to the display region. The pixel units are arranged as an array in the display region of the substrate. The driving lines are disposed in the display region and the peripheral region and are electrically connected to the pixel units. The common lines are disposed in the display region and are extended into the peripheral region. The ESD protection circuit is disposed in the peripheral region of the substrate. The switch elements are disposed in the peripheral region, wherein each of the switch elements is electrically connected between one of the common lines and the ESD protection circuit.

11 Claims, 5 Drawing Sheets

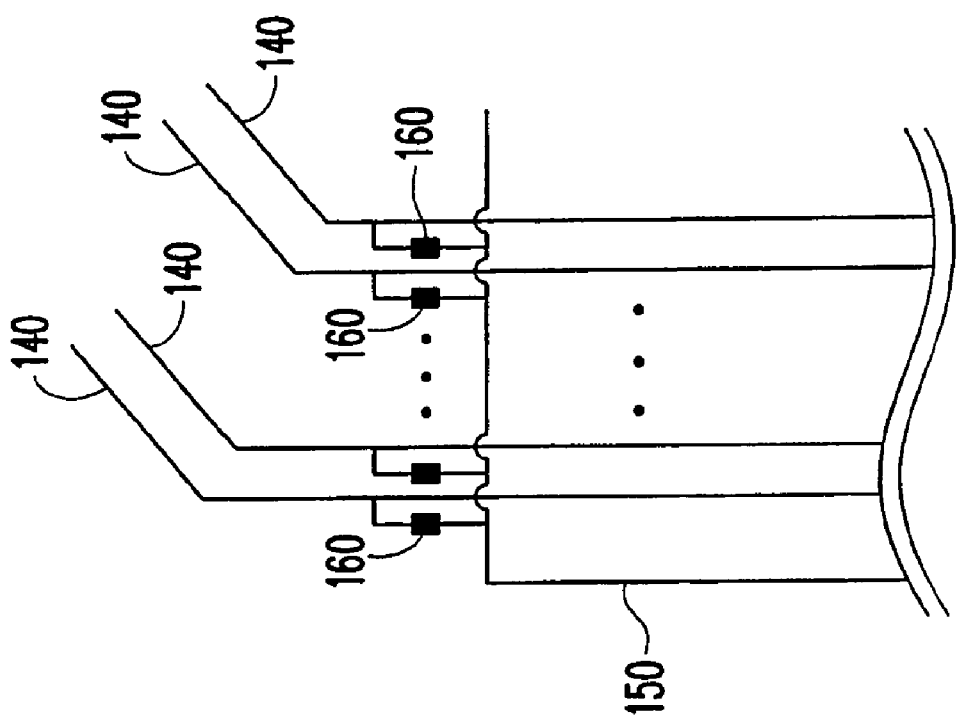

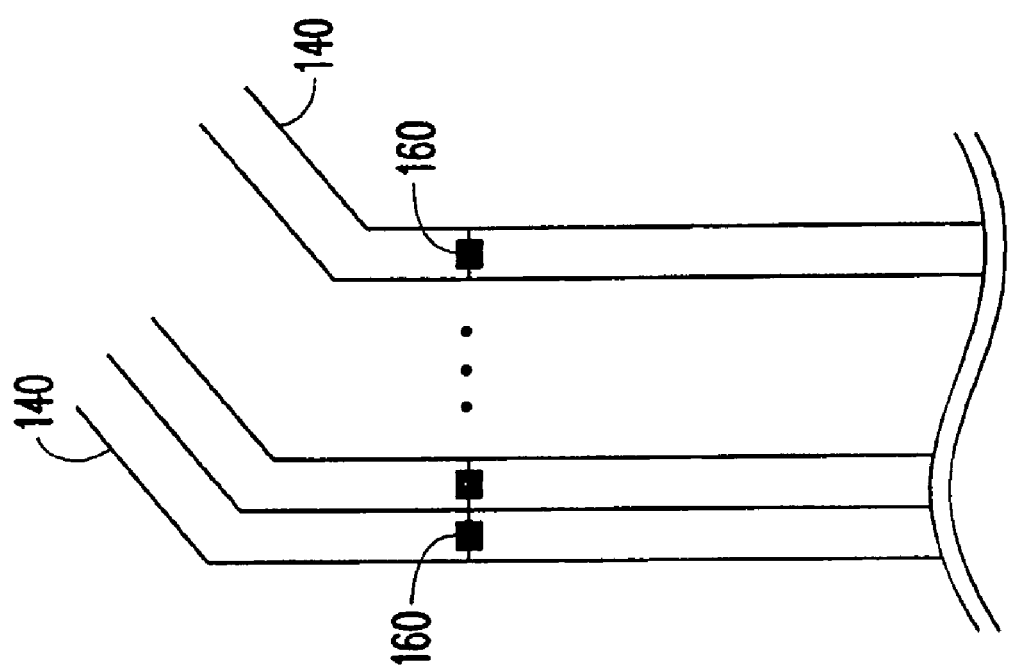

ACTIVE DEVICE ARRAY SUBSTRATE

CROSS-REFERENCE TO RELATED APPLICATION

This application claims the priority benefit of Taiwan application serial no. 96129972, filed on Aug. 14, 2007. The entirety of the above-mentioned patent application is hereby incorporated by reference herein and made a part of this specification.

BACKGROUND OF THE INVENTION

1. Field of the Invention

The present invention generally relates to an active device array substrate, in particular, to an active device array substrate having an electrostatic discharge (ESD) protection circuit.

2. Description of Related Art

Electrostatic discharge (ESD) is very common in our daily life. Because electrons have different affinities to different objects, charge transfer between two objects can be easily produced when the two objects are brought into contact and then separated, and accordingly electrostatic will be accumulated. Once a certain quantity of electrostatic has been accumulated in an object, a transient current may be produced when this object approaches or contacts another object at different electrical potential, and this phenomenon is referred as electrostatic discharge (ESD).

Generally speaking, an electronic product can be damaged by ESD easily when the electronic product is manufactured, assembled, transported, or even after the electronic product is purchased by a consumer. Thus, an electronic product has to be designed with ESD protection function in order to prolong the lifespan thereof. In particular, the circuits in a product fabricated through advanced semiconductor processes, such as an active device array substrate of a liquid crystal display (LCD), have small size. Thus, when the circuits are attacked by transient ESD of high voltage, the circuit inside the active device array substrate can be permanently damaged and accordingly the circuits are invalided.

In recent years, usually each pixel in an active device array substrate is divided into a main pixel and a sub pixel. The main pixel and the sub pixel are respectively controlled by two thin film transistors (TFT). Such pixels are referred as TFT-TFT type pixels. For providing stable storage capacitances to the pixels, a plurality of independent common lines has to be disposed correspondingly on the active device array substrate. However, these common lines are usually form as a large area of metal lines, and accordingly, electrostatic can be easily accumulated on these common lines to produce ESD. As a result, these common lines and devices or circuits around the common lines will be damaged by ESD.

SUMMARY OF THE INVENTION

Accordingly, the present invention is directed to an active device array substrate having an electrostatic discharge (ESD) protection circuit.

The present invention provides an active device array substrate including a substrate, a plurality of pixel units, a plurality of driving lines, a plurality of common lines, an ESD protection circuit, and a plurality of switch elements. The substrate has a display region and a peripheral region adjacent to the display region. The pixel units are arranged as an array in the display region of the substrate. The driving lines are disposed in the display region and the peripheral region and are electrically connected to the pixel units. The common lines are disposed in the display region and are extended into the peripheral region. The ESD protection circuit is disposed in the peripheral region of the substrate. The switch elements are disposed in the peripheral region, and each of the switch elements is electrically connected between one of the common lines and the ESD protection circuit.

The present invention further provides an active device array substrate including a substrate, a plurality of pixel units, a plurality of driving lines, a plurality of common lines, and a plurality of switch elements. The substrate has a display region and a peripheral region adjacent to the display region. The pixel units are arranged as an array in the display region of the substrate. The driving lines are disposed in the display region and the peripheral region and are electrically connected to the pixel units. The common lines are disposed in the display region and are extended into the peripheral region. The switch elements are disposed in the peripheral region, and each of the switch elements is electrically connected between two adjacent common lines.

According to an embodiment of the present invention, the switch elements include bidirectional switch elements.

According to an embodiment of the present invention, each of the switch elements includes a first thin film transistor (TFT) and a second TFT. The first TFT has a first gate and a first source/drain, and the second TFT has a second gate and a second source/drain, wherein the first gate is electrically connected to the second source/drain, and the second gate is electrically connected to the first source/drain.

According to an embodiment of the present invention, each of the switch elements includes a first diode and a second diode. The first diode has a first output terminal and a first input terminal, and the second diode has a second output terminal and a second input terminal, wherein the first output terminal is electrically connected to the second input terminal, and the second output terminal is electrically connected to the first input terminal.

According to an embodiment of the present invention, the ESD protection circuit of the active device array substrate is grounded or floated.

According to an embodiment of the present invention, the pixel units include a plurality of active devices and a plurality of pixel electrodes. The active devices are electrically connected to the corresponding driving lines, and the pixel electrodes are electrically connected to the corresponding active devices.

In the present invention, each of the switch elements is electrically connected between one of the common lines and the ESD protection circuit, or, each of the switch elements is electrically connected between two adjacent common lines. Thus, even though the common lines are formed as a large metal area, the electrostatic accumulated on the common lines can be dissipated. So, the common lines and device or circuits around the common lines can be protected from ESD.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a partial view of the active device array substrate in FIG. 1 around the common lines.

FIG. 5 is a partial view of the active device array substrate in FIG. 4 around the common lines.

DESCRIPTION OF THE EMBODIMENTS

Figure 1:
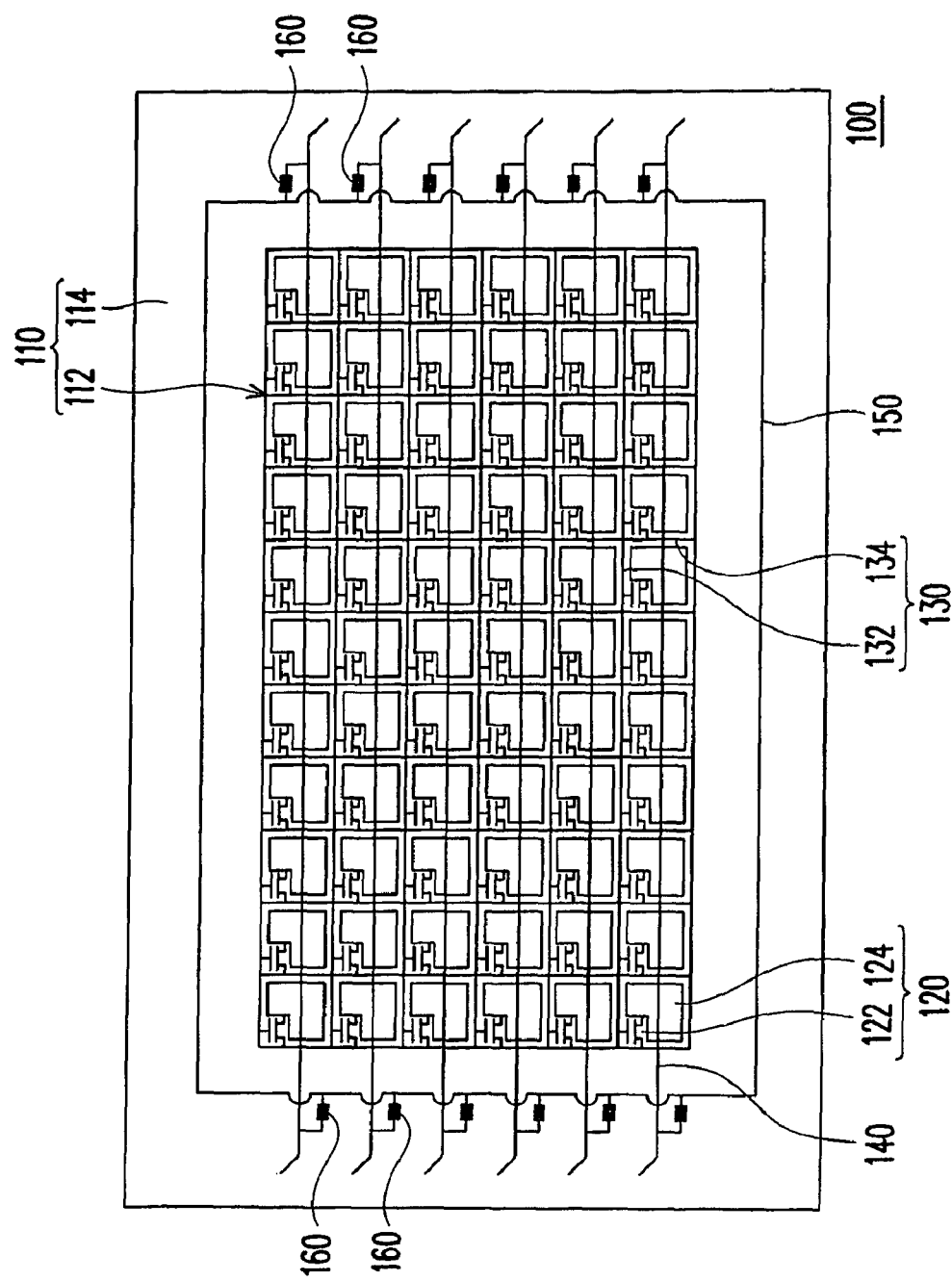
FIG. 1 is a diagram of an active device array substrate according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIG. 1 is a diagram of an active device array substrate according to the first embodiment of the present invention. Referring to FIG. 1, the active device array substrate 100 includes a substrate 110, a plurality of pixel units 120, a plurality of driving lines 130, a plurality of common lines 140, an electrostatic discharge (ESD) protection circuit 150, and a plurality of switch elements 160. The substrate 110 has a display region 112 and a peripheral region 114, and the peripheral region 114 is adjacent to the display region 112. The pixel units 120 are arranged as an array in the display region 112 of the substrate 110. The driving lines 130 are disposed in the display region 112 and the peripheral region 114 and are electrically connected to the pixel units 120. The common lines 140 are disposed in the display region 112 and are extended into the peripheral region 114. The ESD protection circuit 150 is disposed in the peripheral region 114 of the substrate 110. The switch elements 160 are disposed in the peripheral region 114, and each of the switch elements 160 is electrically connected between one of the common lines 140 and the ESD protection circuit 150.

Referring to FIG. 1 again, the driving lines 130 disposed in the display region 112 can be further classified into scan lines 132 and data lines 134 according to the positions and characteristics thereof. In addition, in the active device array substrate 100, each of the pixel units 120 includes an active device 122 and a pixel electrode 124, wherein the active device 122 is electrically connected to the corresponding scan line 132 and data line 134, and the pixel electrode 124 is electrically connected to the active device 122. However, the composition of the pixel units 120 is not limited in the present embodiment. In another embodiment of the present invention, each of the pixel units 120 may also include two active devices (not shown), and a main pixel electrode (not shown) and a sub pixel electrode (not shown) respectively driven by the two active devices.

In the present embodiment, the material of the substrate 110 may be glass, and the material of the driving lines 130 may be metal of high conductivity. The material of the pixel electrode 124 may be indium tin oxide (ITO), indium zinc oxide (IZO), or other transparent conductive materials. The active devices 122 may be thin film transistors (TFTs) or other tri-terminal active devices.

FIG. 2 is a partial view of the active device array substrate in FIG. 1 around the common lines. Referring to both FIG. 1 and FIG. 2, the common lines 140 are used for forming storage capacitors in the pixel units 120. It should be noted that a switch element 160 is disposed on each common line 140, and the common line 140 is electrically connected to the ESD protection circuit 150 via the switch element 160. In particular, the ESD protection circuit 150 may be grounded or floated, and the switch elements 160 may be bidirectional switch elements. Possible implementation patterns of the switch elements 160 will be described below.

Figure 3B:
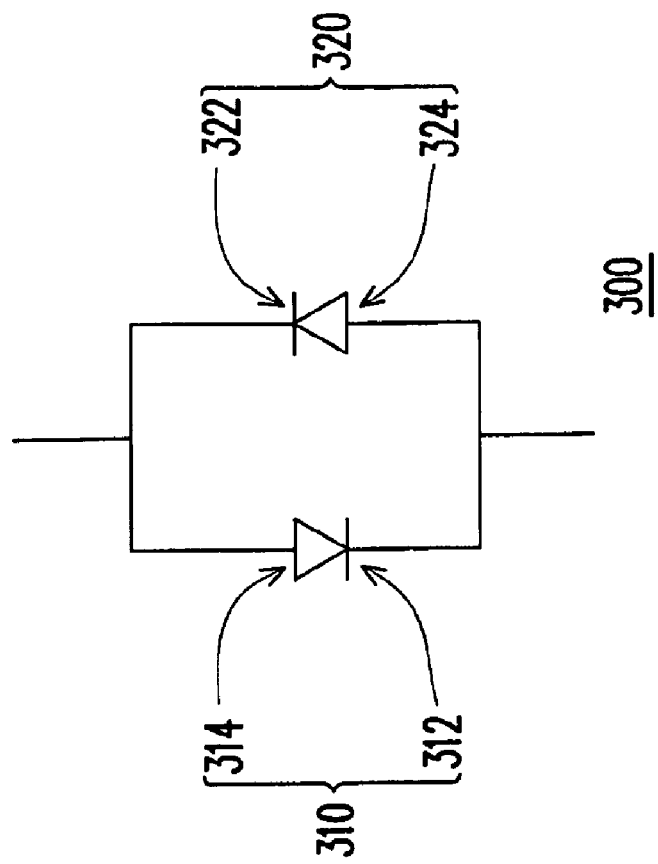
FIG. 3A and FIG. 3B illustrate two embodiments of the switch elements in FIG. 2.
Figure 3A:
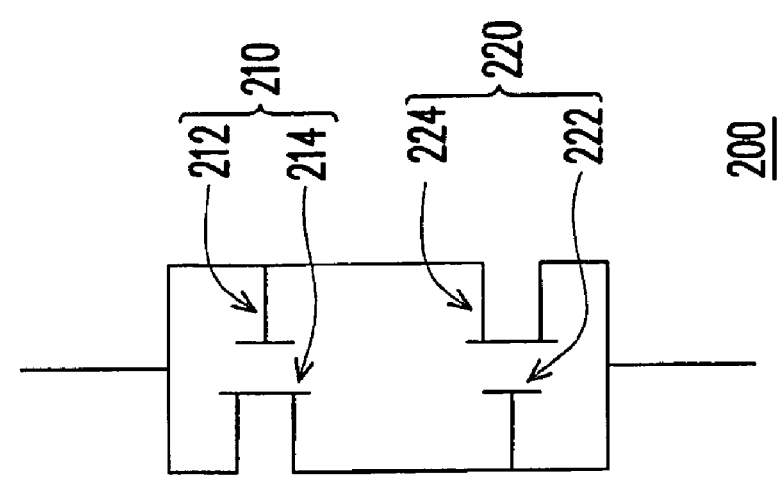

FIG. 3A and FIG. 3B illustrate two embodiments of the switch elements in FIG. 2. First, referring to FIG. 3A, the switch element 200 includes a first TFT 210 and a second TFT 220. The first TFT 210 has a first gate 212 and a first source/drain 214, and the second TFT 220 has a second gate 222 and a second source/drain 224, wherein the first gate 212 is electrically connected to the second source/drain 224, and the second gate 222 is electrically connected to the first source/drain 214.

Then referring to FIG. 3B, the switch element 300 includes a first diode 310 and a second diode 320. The first diode 310 has a first output terminal 312 and a first input terminal 314, and the second diode 320 has a second output terminal 322 and a second input terminal 324, wherein the first output terminal 312 is electrically connected to the second input terminal 324, and the second output terminal 322 is electrically connected to the first input terminal 314. In other words, the switch elements 160 illustrated in FIG. 1 and FIG. 2 can be implemented as the switch element 200 illustrated in FIG. 3A or the switch element 300 illustrated in FIG. 3B.

In particular, through the dispositions of the ESD protection circuit 150 and the switch elements 160, accumulation of electrostatic on the common lines 140 which form a large metal area can be prevented. In detail, referring to FIG. 2 again, when the common lines 140 are operated within a normal voltage range, the switch elements 160 are in "off" state. Thus, the common lines 140 can form storage capacitors in the pixel units 120 normally.

However, when a large quantity of electrostatic is accumulated on or conducted into the common lines 140 and the quantity of the electrostatic exceeds the threshold voltage of the switch elements 160, the switch elements 160 will be turned on. So, the electrostatic can be conducted into the ESD protection circuit 150 and dissipated. Accordingly, the common lines 140 and devices or circuits around the common lines 140 can be protected from ESD, and the lifespan of the active device array substrate can be prolonged.

Second Embodiment

Figure 4:
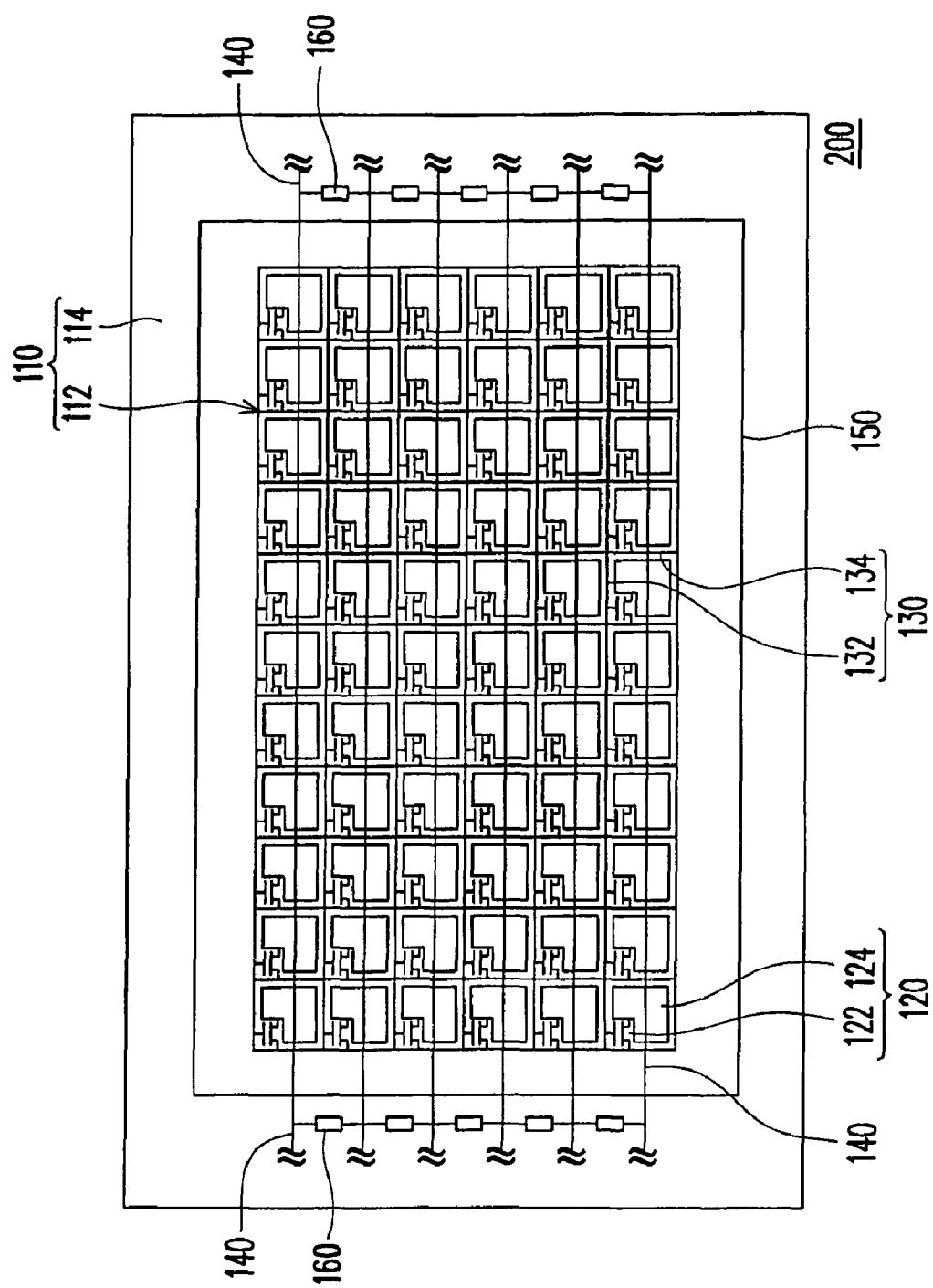
FIG. 4 is a diagram of an active device array substrate according to a second embodiment of the present invention.

FIG. 4 is a diagram of an active device array substrate according to the second embodiment of the present invention. Referring to FIG. 4, the components and the coupling relationships thereof in the active device array substrate 200 of the present embodiment are similar to those of the active device array substrate 100 in the first embodiment, and are labelled likely therefore will not be described herein. Only the difference between the two active device array substrates 100, 200 will be described herein. It should be noted that in the present embodiment, the switch elements 160 are disposed in the peripheral region 114, and each of the switch elements 160 is electrically connected between two adjacent common lines 140.

FIG. 5 is a partial view of the active device array substrate in FIG. 4 around the common lines. Referring to both FIG. 4 and FIG. 5, each switch element 160 is disposed between adjacent two common lines 140, and the switch element 160 may be a bidirectional switch element. Similarly, the switch elements 160 may be implemented as illustrated in FIG. 3A or FIG. 3B.

To be specific, when the common lines 140 are operated within a normal voltage range, the switch elements 160 are in "off" state, so that the common lines 140 can form storage capacitors in the pixel units 120 normally. However, when a large quantity of electrostatic is accumulated on or conducted into the common lines 140 and the quantity of the electrostatic exceeds the threshold voltage of the switch elements 160, the switch elements 160 are turned on. So, the electrostatic is conducted into the adjacent common lines 140 and dissipated. Accordingly, the common lines 140 and devices or circuits around the common lines 140 can be protected from ESD, and the lifespan of the active device array substrate can be prolonged.

In overview, the active device array substrate provided by the present invention has at least following advantages.

In the active device array substrate provided by the present invention, each of the switch elements is electrically connected between one of the common lines and the ESD protection circuit, or between two adjacent common lines, thus, even though the common lines are form as a large metal area and accordingly produce a large quantity of electrostatic, the electrostatic can be dissipated easily. Accordingly, the common lines and devices or circuits around the common lines can be protected from ESD. Moreover, the lifespan of the active device array substrate can be prolonged.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, comprising:
    a substrate, having a display region and a peripheral region adjacent to the display region;
    a plurality of pixel units, arranged as an array in the display region of the substrate;
    a plurality of driving lines, disposed in the display region and the peripheral region and electrically connected to the pixel units;
    a plurality of common lines, disposed in the display region and extended into the peripheral region;
    an ESD protection circuit, disposed in the peripheral region of the substrate; and
    a plurality of switch elements, disposed in the peripheral region, each of the switch elements being electrically connected between one of the common lines and the ESD protection circuit.

2. The active device array substrate according to claim 1, wherein the switch elements comprise bidirectional switch elements.

3. The active device array substrate according to claim 1, wherein each of the switch elements comprises:
    a first TFT, having a first gate and a first source/drain; and
    a second TFT, having a second gate and a second source/drain,
    wherein the first gate is electrically connected to the second source/drain, and the second gate is electrically connected to the first source/drain.

4. The active device array substrate according to claim 1, wherein each of the switch elements comprises:
    a first diode, having a first output terminal and a first input terminal; and
    a second diode, having a second output terminal and a second input terminal;
    wherein the first output terminal is electrically connected to the second input terminal, and the second output terminal is electrically connected to the first input terminal.

5. The active device array substrate according to claim 1, wherein the ESD protection circuit is grounded or floated.

6. The active device array substrate according to claim 1, wherein the pixel units comprise:
    a plurality of active devices, electrically connected to the corresponding driving lines; and
    a plurality of pixel electrodes, electrically connected to the corresponding active devices.

7. An active device array substrate, comprising:
    a substrate, having a display region and a peripheral region adjacent to the display region;
    a plurality of pixel units, arranged as an array in the display region of the substrate;
    a plurality of driving lines, disposed in the display region and the peripheral region and electrically connected to the pixel units;
    a plurality of common lines, disposed in the display region and extended into the peripheral region; and
    a plurality of switch elements, disposed in the peripheral region, and each of the switch elements being electrically connected between two adjacent common lines.

8. The active device array substrate according to claim 7, wherein the switch elements comprise bidirectional switch elements.

9. The active device array substrate according to claim 7, wherein each of the switch elements comprises:
    a first TFT, having a first gate and a first source/drain; and
    a second TFT, having a second gate and a second source/drain,
    wherein the first gate is electrically connected to the second source/drain, and the second gate is electrically connected to the first source/drain.

10. The active device array substrate according to claim 7, wherein each of the switch elements comprises:
    a first diode, having a first output terminal and a first input terminal; and
    a second diode, having a second output terminal and a second input terminal;
    wherein the first output terminal is electrically connected to the second input terminal, and the second output terminal is electrically connected to the first input terminal.

11. The active device array substrate according to claim 7, wherein the pixel units comprise:
    a plurality of active devices, electrically connected to the corresponding driving lines; and
    a plurality of pixel electrodes, electrically connected to the corresponding active devices.

* * * * *